(12) United States Patent
Choi

(10) Patent No.: US 12,176,208 B2
(45) Date of Patent: Dec. 24, 2024

(54) WAFER PROCESS, APPARATUS AND METHOD OF MANUFACTURING AN ARTICLE

(71) Applicant: CANON KABUSHIKI KAISHA, Tokyo (JP)

(72) Inventor: Byung-Jin Choi, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 349 days.

(21) Appl. No.: 17/387,243

(22) Filed: Jul. 28, 2021

(65) Prior Publication Data

US 2021/0358746 A1 Nov. 18, 2021

Related U.S. Application Data

(62) Division of application No. 16/696,944, filed on Nov. 26, 2019, now Pat. No. 11,107,678.

(51) Int. Cl.
*H01L 21/02* (2006.01)
*B05D 3/06* (2006.01)
*H01L 21/687* (2006.01)

(52) U.S. Cl.
CPC ........ *H01L 21/02348* (2013.01); *B05D 3/067* (2013.01); *H01L 21/0201* (2013.01); *H01L 21/687* (2013.01)

(58) Field of Classification Search
CPC ............. B05D 3/067; H01L 21/02348; H01L 21/0201; H01L 21/31058; H01L 21/67115; H01L 21/687; H01L 21/681
See application file for complete search history.

(56) References Cited

U.S. PATENT DOCUMENTS

| | | | |
|---|---|---|---|
| 2013/0078821 A1* | 3/2013 | Furutono | G03F 7/0002 264/447 |
| 2013/0207288 A1* | 8/2013 | Mikami | G03F 7/0002 425/171 |
| 2022/0299869 A1* | 9/2022 | Iwasaki | H01L 21/324 |

FOREIGN PATENT DOCUMENTS

| | | |
|---|---|---|
| JP | 2013069918 A | 4/2013 |
| JP | 2013168504 A | 8/2013 |
| JP | 2019186532 A | 10/2019 |
| KR | 20190022763 A | 3/2019 |

* cited by examiner

*Primary Examiner* — Dale E Page
*Assistant Examiner* — John M Parker
(74) *Attorney, Agent, or Firm* — Canon U.S.A., Inc. I.P. Division

(57) ABSTRACT

An apparatus is provided. The apparatus has a chuck having a first side configured to retain a superstrate or a template and a second side, an array of image sensors disposed at the second side of the chuck and spaced from the chuck, and an array of light sources disposed between the transparent chuck and the array of image sensors.

12 Claims, 6 Drawing Sheets

WAFER PROCESS, APPARATUS AND METHOD OF MANUFACTURING AN ARTICLE

CROSS-REFERENCE TO RELATED APPLICATION

This application is a Divisional of U.S. application Ser. No. 16/696,944, filed Nov. 26, 2019, of which is hereby incorporated by reference herein in its entirety.

BACKGROUND

Field of Art

The present disclosure relates to wafer processing, and more particularly, to the curing process of surfaces in semiconductor fabrication.

Description of the Related Art

Planarization techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArF laser-based lithography, planarization improves depth of focus (DOF), critical dimension (CD), and critical dimension uniformity. In extreme ultraviolet lithography (EUV), planarization improves feature placement and DOF. In nanoimprint lithography (NIL) planarization improves feature filling and CD control after pattern transfer.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed. Improvements in planarization techniques, including IAP techniques, are desired for improving, e.g., whole wafer processing and semiconductor device fabrication.

SUMMARY

An apparatus is provided. The apparatus comprises a chuck having a first side configured to retain a superstrate or a template and a second side; an array of image sensors disposed at the second side of the chuck and spaced from the chuck; and an array of light sources disposed between the transparent chuck and the array of image sensors. Each of the array of image sensors and the array of the light sources may be spaced from the chuck with a specific distance such that interference of an image acquired from each of the image sensors with light from the light sources is minimized. The array of image sensors and the array of the light sources are arranged to minimize an overlap between each individual image sensor and each individual light source. The chuck is transparent to each of the light sources. The image sensors may be configured to measure visible light. Each of the image sensors is configured to obtain an image of a local area. The apparatus may further comprise an image processor configured to combine the images acquired by each of the image sensors into a single image. The array of light sources is configured to generate UV light to transmit through the chuck and the superstrate and the template. For example, the array of light sources may include an array of UV light emitting diodes (LEDs).

In one embodiment, the apparatus may further comprise a first board for mounting the array of light sources thereon and a second board for mounting the array of image sensors thereon. The first board includes a plurality of holes between the light sources. Preferably, each of the image sensors is aligned with a respective one of the holes.

A curing method is also provided. The method includes depositing a curable material on a substrate; acquiring a plurality of local images of the material by an array of image sensors disposed above the curable material; and curing the material by radiating the material with an array of light sources disposed between the curable material and the array of the image sensors. The method may further comprise radiating the material with UV light by the array of light sources. The array of light sources may include an array of UV LEDs.

Preferably, the plurality of local images is processed into a single image. An overlap between each individual light source and each individual image sensor is minimized. The method further comprises advancing a superstrate or a template to be in contact with the curable material with a chuck before curing the curable material. The chuck is transparent to light radiated from the light sources.

A method for manufacturing an article is provided. The method includes dispensing a formable material on a substrate; retaining a superstrate with a chuck; advancing the chuck to contact the superstrate with the formable material; acquiring a plurality of local images of the material by an array of image sensors disposed above the curable material; curing the material by radiating the material with an array of light sources disposed between the curable material and the array of the image sensors; curing the formable material by radiating light from an array of light sources; separating the superstrate from the cured material on the substrate; and processing the substrate with the cured material to make the article.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

Figure 1:
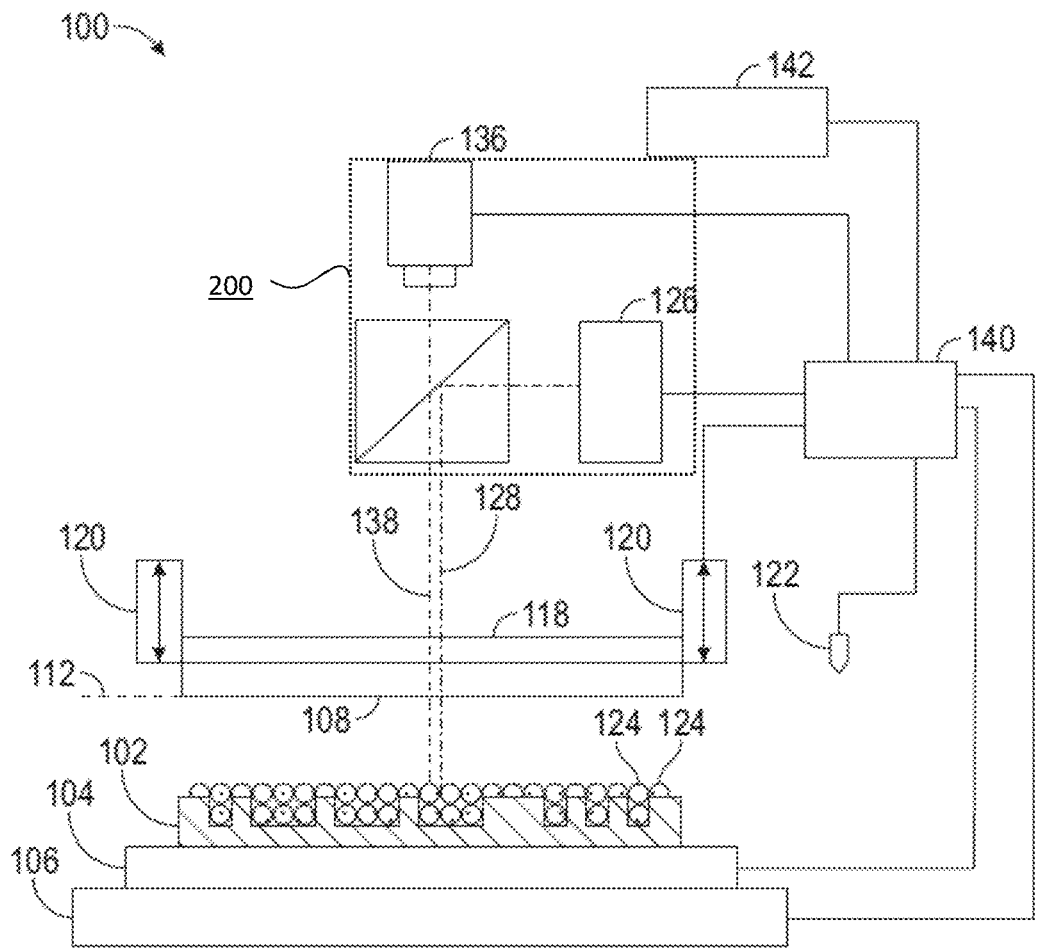
FIG. 1 is a diagram illustrating an apparatus.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Planarization System

FIG. 1 illustrates an apparatus 100 that, among other things, can be used to planarize a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x-, y-, z-, θ-, ψ, and φ-axes. The substrate positioning stage 106, the substrate 102, and the substrate chuck 104 may also be positioned on a base (not shown). The substrate positioning stage may be a part of a positioning system.

Spaced apart from the substrate 102 is a superstrate 108 having a working surface 112 facing substrate 102. Superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate is readily transparent to UV light. Surface 112 is generally of the same areal size or slightly smaller as the surface of the substrate 108. Surface 112 of superstrate 108 can include a planar contact surface. In another embodiment, the contact surface can include features that define any original pattern that forms the basis of a pattern to be formed on the substrate 102.

Superstrate 108 may be coupled to or retained by a superstrate chuck 118. The superstrate chuck 118 may be, but is not limited to, vacuum chuck, pin-type chuck, groove-type chuck, electrostatic chuck, electromagnetic chuck, and/or other similar chuck types. The superstrate chuck 118 may be configured to apply stress, pressure, and/or strain to superstrate 108 that varies across the superstrate 108. In an embodiment the superstrate chuck is likewise readily transparent to UV light. The superstrate chuck 118 may include a system such as a zone based vacuum chuck, an actuator array, a pressure bladder, etc., which can apply a pressure differential to a back surface of the superstrate 108 to cause the template to bend and deform. In one embodiment, the superstrate chuck 118 includes a zone based vacuum chuck which can apply a pressure differential to a back surface of the superstrate, causing the superstrate to bend and deform as further detailed herein.

The superstrate chuck 118 may be coupled to a head 120 which is a part of the positioning system. The head 120 may be movably coupled to a bridge. The head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g. x-, y-, θ-, ψ-, and φ-axis).

The apparatus 100 may further comprise a fluid dispenser 122. The fluid dispenser 122 may also be movably coupled to the bridge. In an embodiment, the fluid dispenser 122 and the head 120 share one or more of all positioning components. In an alternative embodiment, the fluid dispenser 122 and the head move independently from each other. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The apparatus 100 further comprises a curing system that includes a radiation source 126 that directs actinic energy, for example, UV radiation, along an exposure path 128. The head 120 and the substrate positioning state 106 may be configured to position the superstrate 108 and the substrate 102 in superimposition with the exposure path 128. The radiation source 126 sends the actinic energy along the exposure path 128 after the superstrate 108 has contacted the formable material 128. FIG. 1 illustrates the exposure path 128 when the superstrate 108 is not in contact with the formable material 124. This is done for illustrative purposes so that the relative position of the individual components can be easily identified. An individual skilled in the art would understand that exposure path 128 would not substantially change when the superstrate 108 is brought into contact with the formable material 124.

The apparatus 100 further comprises a camera 136 positioned to view the spread of formable material 124 as the superstrate 108 contacts the formable material 124 during the planarization process. FIG. 1 illustrates an optical axis 138 of the field camera's imaging field. As illustrated in FIG. 1, the apparatus 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the surface 112 and the substrate surface.

The apparatus 100 may be regulated, controlled, and/or directed by one or more processors 140 (controller) in communication with one or more components and/or subsystems such as the substrate chuck 104, the substrate positioning stage 106, the superstrate chuck 118, the head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

In operation, the planarization head 120, the substrate position stage 106, or both vary a distance between the superstrate 118 and the substrate 102 to define a desired space (a bounded physical extent in three dimensions) that is filled with the formable material 124. For example, the head 120 may be moved toward the substrate and apply a force to the superstrate 108 such that the superstrate contacts and spreads droplets of the formable material 124 as further detailed herein.

Planarization Process

Figure 2A:
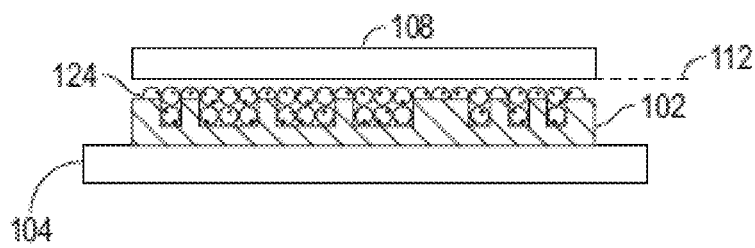
FIG. 2A to 2C illustrate a planarization process.
Figure 2B:
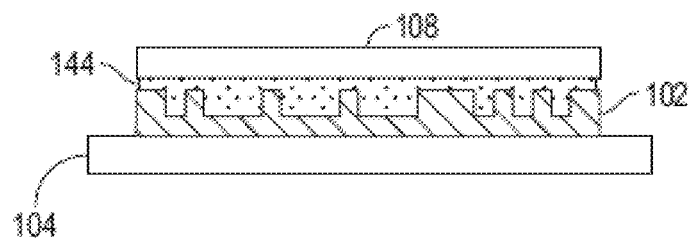
Figure 2C:
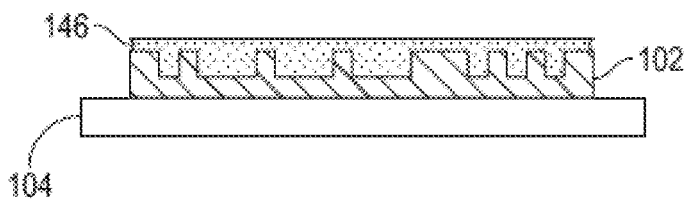

The planarization process includes steps which are shown schematically in FIGS. 2A-2C. As illustrated in FIG. 2A, the formable material 124 is dispensed in the form of droplets onto the substrate 102. As discussed previously, the substrate surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate topography. The superstrate 108 is then positioned in contact with the formable material 124.

FIG. 2B illustrates a post-contact step after the superstrate 108 has been brought into full contact with the formable material 124 but before a polymerization process starts. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. The polymerization process or curing of the formable material 124 may be initiated with actinic radiation (e.g., UV radiation). For example, radiation source 126 of FIG. 1 can provide the actinic radiation causing formable material film 144 to cure, solidify, and/or cross-link, defining a cured planarized layer 146 on the substrate 102. Alternatively, curing of the formable material film 144 can also be initiated by using heat, pressure, chemical reaction, other types of radiation, or any combination of these. Once cured, planarized layer 146 is formed, the superstrate 108 can be separated therefrom. FIG. 2C illustrates the cured planarized layer 146 on the substrate 102 after separation of the superstrate 108.

In an alternative embodiment where the contact surface of superstrate 108 include pattern features, a similar process as described above can be performed to form a patterned layer on substrate 102 (e.g., "whole wafer" patterning). Whole wafer processing is useful in semiconductor device fabrication as well biological or optical device production. Such whole wafer processing can further be adapted such that local film thickness can be tuned as a function of desirable local film thickness.

Integration of UV Unit and Camera Unit

However, integration with a process imaging unit is challenging. One important requirement for the integration is the non-interfering optical paths for the UV unit 126 and the camera 136. In addition, as the exposure intensity of the array of LEDs drops quadratically as a function of distance, a short distance between the array of LEDs and the wafer is required to ensure efficient intensity of UV exposure on the wafer.

Figure 3:
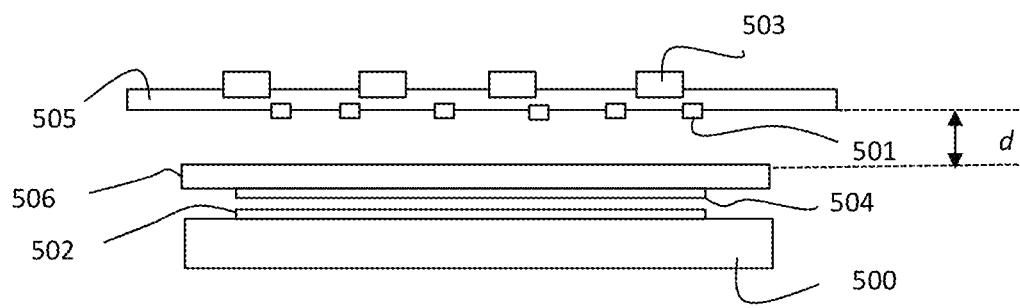
FIG. 3 is a cross sectional view of an assembly of an array of LED curing source and an array of imaging units.

FIG. 3 shows a cross section view of integration of the LEDs used for curing process and the camera for imaging the wafer according to one embodiment. As shown, the wafer 502 to be exposed by the UV radiation is retained by a substrate chuck 500. The template or superstrate 504 above the wafer 504 is retained by a superstrate chuck 504. An assembly of an array of LEDs 501 and an array of imaging sensors or imaging units 503 are placed above the superstrate chuck 506. The superstrate chuck 506 is transparent to allow the imaging units 503 to capture images of the wafer 502, and also allow the UV radiation to transmit through. The array of LEDs 501 and an array of imaging units 503 are supported by a board 505. It is desired that the LEDs 501 provide predetermined UV intensity profiles for the whole wafer 502. As the exposure area is significantly larger than that of the LEDs 501, a larger surface area of the LED assembly can be unoccupied. Therefore, multiple imaging units 503 can be integrated at the unoccupied area to capture process imaging as the process requires. Each of the imaging units 503 may capture images of a local area of the wafer 502. The images captured by the multiple imaging units 503 can then be digitally integrated into a whole wafer image if needed. Alternatively, when partial images of the wafer are required, images of selected portions of the wafer can be captured.

As the arrays of LEDs 501 and the array of imaging units 403 are assembled in the same board without overlapping with each other, a long distance is not required to prevent the optical paths of the LEDs 501 and the imaging units 503 from interfering with each other. For a 300 mm wafer as shown in FIG. 3, the distance d between the assembly of the LEDs 501 and the imaging units 503 is reduced to about 35 mm.

Figure 4:
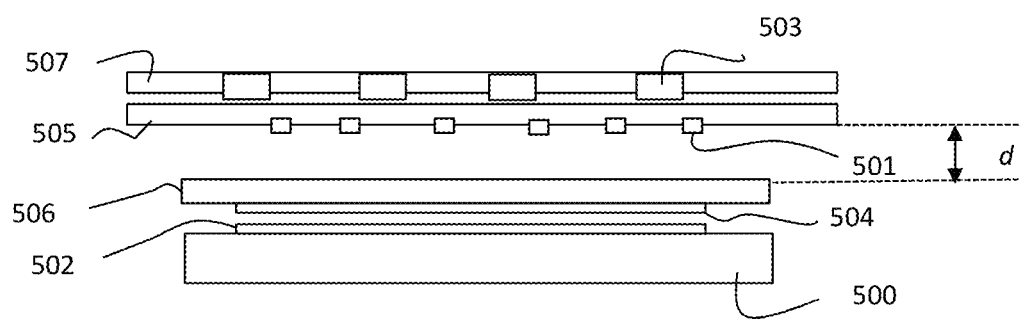
FIG. 4 is a cross sectional view of another example of assembling an array of LED curing source with an array of imaging unit.
Figure 5:
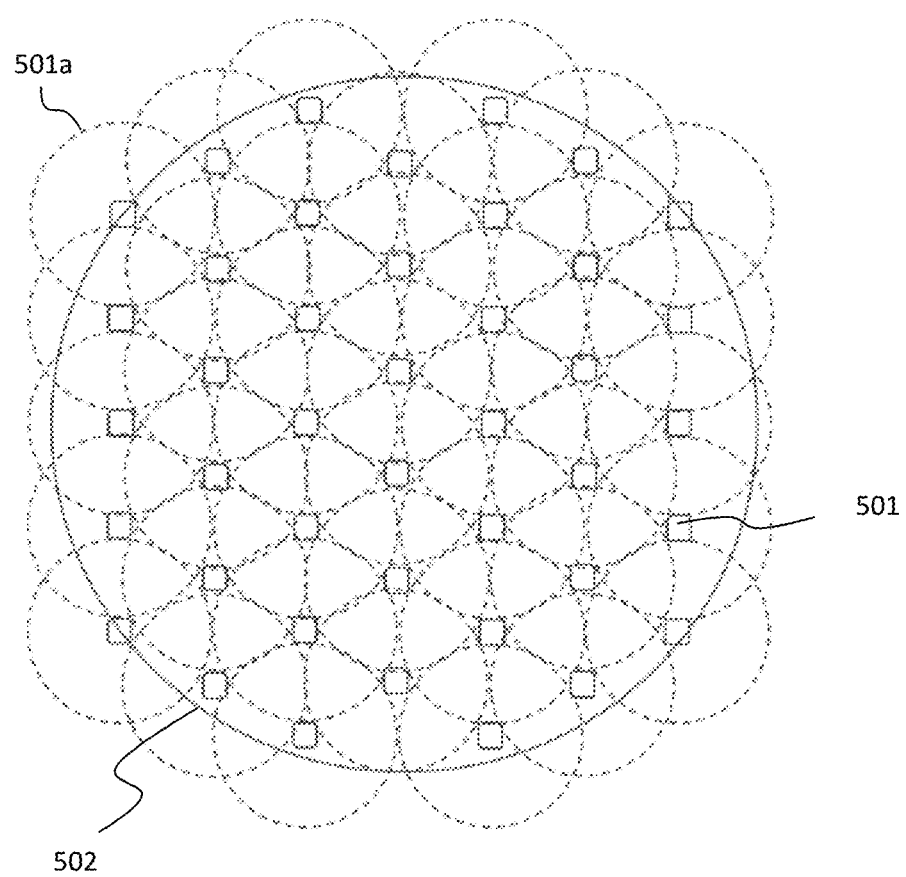
FIG. 5 shows a top view of the array of LEDs to be integrated with an array of imaging units.

The LEDs 501 and the imaging units 503 can also be assembled in two separate boards 505 and 507 as shown in FIG. 4. The distance between the boards 505 and 507 is maintained sufficiently small to achieve the same effect as using a single board as shown in FIG. 5. In addition, the board 505 is either transparent or includes holes or apertures to allow the imaging units 503 to capture the images of the wafer without obstruction.

Although LEDs 501 appear to be the efficient selection for the UV radiation used in the curing process, other types of light sources able to provide sufficient intensity and similar characteristics can also be used for wafer exposure. The imaging units 503 may be selected from sensors that can measure visible light.

Figure 6:
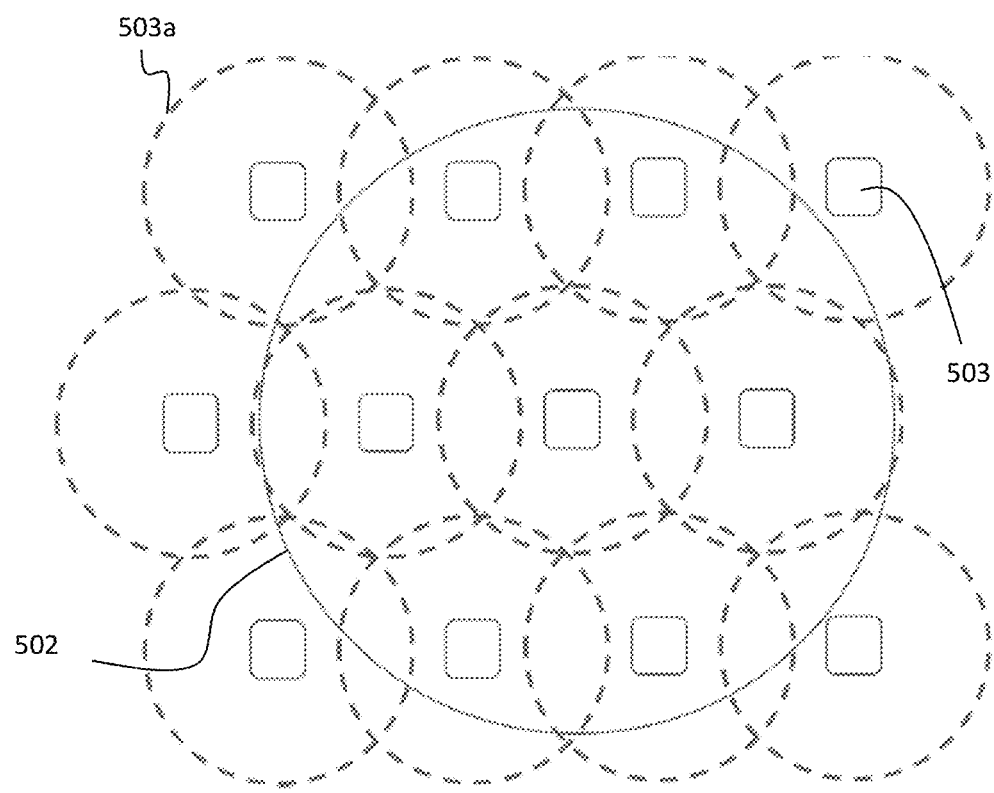
FIG. 6 shows a top view of the array of imaging units to be integrated with the array of LEDs.
Figure 7:
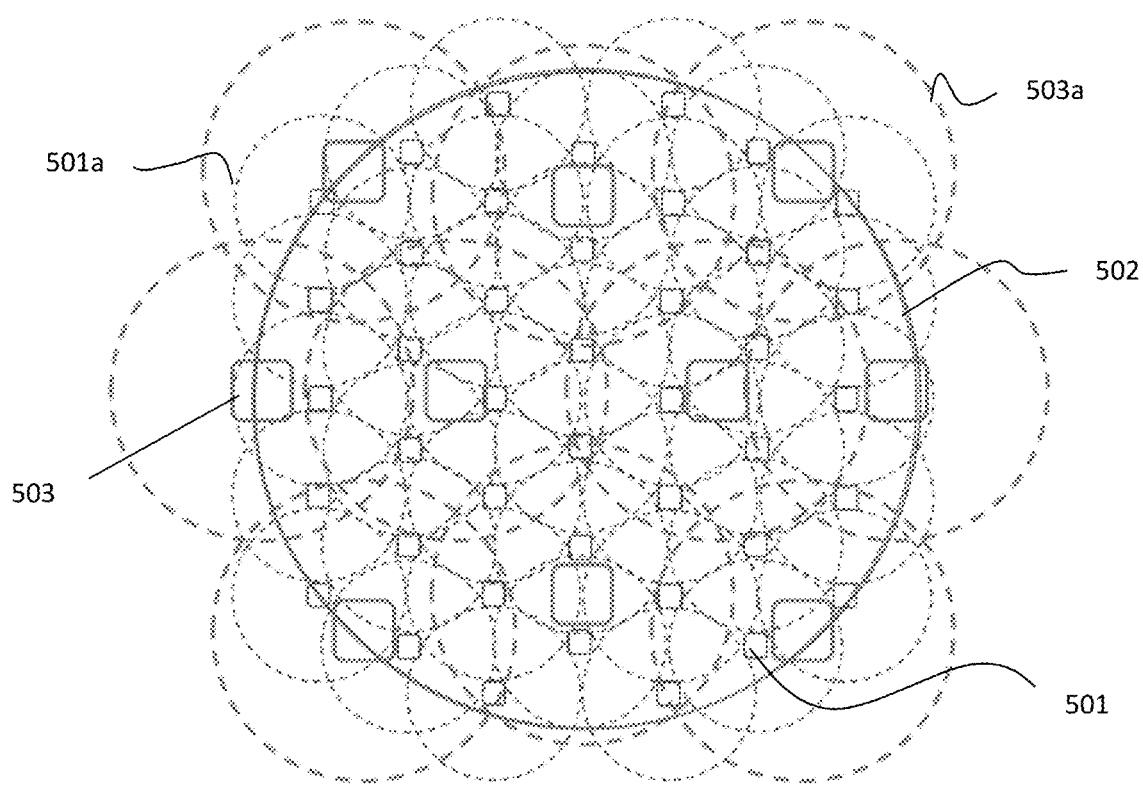
FIG. 7 is a top view showing the integrated LEDs and imaging units.

FIG. 5 is a top view showing the layout of the array of LEDs 501. The dash-line circles 501a show the exposure range for each of the LEDs 501. The arrangement of the LEDs 501 allows the whole wafer 502 to be exposed by the UV light with the predetermined intensity. FIG. 6 is a top view showing the array of imaging units 503. As shown, each of the imaging units 503 is able to capture the image of a portion of the wafer 502. The array of imaging units 503 may also be configured to capture images of the surrounding area of the wafer 502. The array of LEDs 501 and the array of imaging unit 503 are overlapped with each other as shown in the top view of FIG. 7. As shown in FIG. 7, each of the imaging units 503 is arranged at a location that is not occupied by the LEDs 501, and preferably, the array of imaging units can be adjusted locally to prevent interference with LEDs 501 to result in a continuous field of view (FOV).

Figure 8:
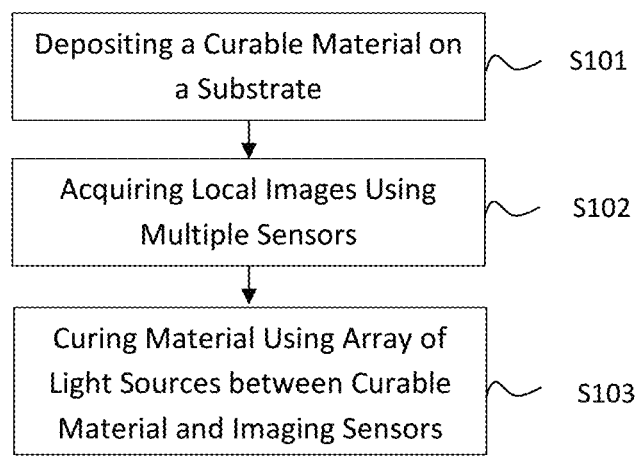
FIG. 8 shows a process of using the integrated UV source and camera to form a layer.

FIG. 8 shows a curing process using the integration of camera and curing source. In Step 101, a curable material is deposited on a substrate. An assembly of an array of imaging sensors and an array of LEDs as shown in FIGS. 3 to 8 is used to perform curing and imaging processes. In Step S102, the array of imaging sensors is used to capture images of the wafer. As discussed above, each of the imaging sensors is able to capture a local area of the wafer. In Step S103, the array of LEDs is located between the curable material and the imaging sensors to radiate the curable material with predetermined intensity and profile. The process may also include a step of integrating the images captured by the multiple imaging sensors into an image of the whole wafer. Alternately, when a partial image of the wafer is desired, images captured by the corresponding imaging sensors are integrated into a single image.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A curing method, comprising:
   depositing a curable material on a substrate;
   acquiring a plurality of local images of the deposited material by an array of image sensors disposed above the curable material; and
   curing the material by radiating the material with an array of light sources disposed between the curable material and the array of the image sensors,
   wherein the array of light sources includes a plurality of light sources arranged along two dimensional directions in a top view,
   wherein the array of image sensors includes a plurality of image sensors arranged along two dimensional directions in the top view,
   wherein the plurality of light sources includes a light source disposed between the plurality of image sensors, and
   wherein the plurality of image sensors includes an image sensor disposed between the plurality of light sources.

2. The curing method of claim 1, further comprising radiating the material with UV light by the array of light sources.

3. The curing method of claim 1, wherein the array of light sources includes an array of UV LEDs.

4. The curing method of claim 1, further comprising processing the plurality of local images of a local area of a wafer into a single image of a whole wafer.

5. The curing method of claim 1, further comprising minimizing an overlap between each individual light source and each individual image sensor.

6. The curing method of claim 1, further comprising:
   advancing a superstrate or a template to be in contact with the curable material with a chuck before curing the curable material.

7. The curing method of claim 6, wherein the chuck is transparent to light radiated from the light sources.

8. The curing method of claim 1,
   wherein, in the top view, the plurality of light sources is disposed between the two image sensors of the array of image sensors.

9. The curing method of claim 1,
   wherein, in the top view, the at least one light source includes a first plurality of light sources arranged along a first direction and second plurality of light sources arranged along a second direction perpendicular to the first direction,
   wherein, in the top view, the array of image sensors includes a first plurality of image sensors arranged along the first direction and a second plurality of mage sensors arranged in the second direction,
   wherein, in the top view, the first plurality of light sources are disposed between the first plurality of image sensors, and
   wherein in the top view, the second plurality of light sources are disposed between the second plurality of image sensors.

10. The curing method of claim 1, wherein a range of exposure by the array of light sources includes a whole wafer.

11. The curing method of claim 1,
    wherein the array of image sensors includes a first image sensor, a second image sensor, and a third image sensor,
    wherein a range of capture of the first image sensor overlaps with a range of capture of the second image sensor, and
    wherein the range of capture of the first image sensor overlaps with a range of capture of the third image sensor.

12. A method for manufacturing an article, comprising:
    dispensing a formable material on a substrate;
    retaining a superstrate with a chuck;
    advancing the chuck to contact the superstrate with the formable material;
    acquiring a plurality of local images of the material by an array of image sensors disposed above the formable material;
    curing the material by radiating the material with an array of light sources disposed between the formable material and the array of the image sensors,
    wherein the array of light sources includes a plurality of light sources arranged along two dimensional directions in a top view,
    wherein the array of image sensors includes a plurality of image sensors arranged along two dimensional directions in the top view,
    wherein the plurality of light sources includes a light source disposed between the plurality of image sensors, and
    wherein the plurality of image sensors includes an image sensor disposed between the plurality of light sources;
    separating the superstrate from the cured material on the substrate; and processing the substrate with the cured material to make the article.

\* \* \* \* \*